United States Patent [19]

Malocha

[11] 4,200,849
[45] Apr. 29, 1980

[54] TUNED UNIDIRECTIONAL SURFACE WAVE TRANSDUCER

[75] Inventor: Donald C. Malocha, Plano, Tex.

[73] Assignee: University of Illinois Foundation, Urbana, Ill.

[21] Appl. No.: 920,798

[22] Filed: Jun. 30, 1978

[51] Int. Cl.² .......... H03H 9/04; H03H 9/20; H03H 9/26; H01L 41/10
[52] U.S. Cl. .................. 333/194; 310/313; 333/151; 333/196
[58] Field of Search ............ 310/313; 333/193–196, 333/150–155

[56] References Cited

U.S. PATENT DOCUMENTS 3,866,154  2/1975  Moore .................. 310/313

OTHER PUBLICATIONS

Kimbark–"Electrical Transmission of Power and Signals," John Wiley & Sons, New York, 1958, pp. 220–223.

Primary Examiner—Alfred E. Smith
Assistant Examiner—Marvin Nussbaum
Attorney, Agent, or Firm—Martin Novack

[57] ABSTRACT

A surface acoustic wave device having a unidirectional input transducer is provided with an input tuning circuit which eliminates the reactive portions of the device's input impedance. The input transducer has a pair of input ports, each of which exhibits an impedance $A\angle\phi$. A series tuning circuit including reactances having a magnitude of $A(\sin\phi+\cos\phi)$ and $A(\sin\phi-\cos\phi)$ respectively, is connected to the input ports. An alternative parallel reactive tuning circuit is disclosed whose reactances are $A/(\sin\phi+\cos\phi)$ and $A/(\sin\phi-\cos\phi)$ respectively.

7 Claims, 5 Drawing Figures

TUNED UNIDIRECTIONAL SURFACE WAVE TRANSDUCER

The work which led to this invention was supported in part by AF Contract (F-33615-75-C-1291) Avionics Laboratory WPAFB and by Joint Services Electronics Contract DAAB-07-72-C-0259.

BACKGROUND OF THE INVENTION

1. Field of Invention.

This invention relates to surface acoustic wave (SAW) devices and more particularly to SAW devices which are provided with unidirectional input transducers.

2. Prior Art.

SAW devices are well known in the art as being particularly adapted to signal filtering applications. One of their main advantages is that they can be constructed utilizing the identical photolithographic techniques which are employed to produce monolithic integrated circuits and when so constructed, are compatible with such circuits.

The design of a SAW device is essentially a tradeoff wherein one design parameter is balanced against another to achieve the desired result. For instance, a SAW device's insertion loss can be reduced by adding an input tuning circuit which balances and cancels the reactance of the SAW device. This has most often been suggested with SAW devices which employ bidirectional input transducers. Such circuits are shown in U.S. Pat. Nos. 3,582,837; 4,007,433 and 3,827,002. While the suggested tuning circuits provide the desired result, i.e., the elimination of the capacitive reactance inherent in the input transducer, they have no effect upon the triple transit loss which is also inherent when bidirectional transducers are employed. Triple transit losses arise as a result of the subtraction between a reflected surface wave in the SAW device and the applied input signal-resulting in a lessened effective input signal.

A well-known solution to the triple result loss problem is the substitution of a unidirectional input transducer in place of a bidirectional input transducer. A unidirectional transducer has the property of causing a wave to propagate only in one direction upon energization of its inputs with quadrature related input voltages. It has the further property of being substantially insensitive to reflections from the output transducer and thereby largely eliminates the problem of triple transit signal reflections. Unidirectional transducers are well-known in the art and examples may be found in U.S. Pat. Nos. 3,800,248; 3,845,419 and 3,866,154.

In order to achieve the requisite phase relationship at the inputs of a unidirectional transducer, the prior art simplistically suggests the imposition of a 90 degree phase shifter between the source of signal and one of the transducer's inputs. 90 degree phase shifters are known in the prior art but as a general rule, require a number of components to achieve the required phase shift; add to the insertion loss of the SAW device; and furthermore, create an imbalance in the voltage applied to the device's input ports.

OBJECTS AND SUMMARY OF THE INVENTION

It is accordingly, an objective of this invention to provide a SAW device with a tuned unidirectional input transducer.

It is another object of this invention to provide a tuning network for a unidirectional SAW transducer which applies quadrature related signals of equal power to the input ports of the transducer.

It is a further object of this invention to provide a tuning network for a unidirectional SAW transducer which is comprised of a minimum number of components and which does not add to the device's insertion loss.

In accordance with the above objects, it has been found that an extremely simple tuning network can be constructed for a unidirectional input transducer when the necessary quadrature relationship is created by allocating a partial phase shift to each port of the transducer. In specific, a reactance is coupled to each port and results in the input signal seeing equal effective impedances at each port, but with one impedance exhibiting a plus 45 degree relationship to the origin and the other impedance a minus 45 degree relationship to the origin. This phase relationship has been found to enable the utilization of a simple tapped coil as the tuning network for many SAW device configurations and for certain other SAW configurations, the combination of a coil and capacitor.

A tuning circuit constructed in accordance with this invention fulfills four requirements. First, it eliminates substantially all of the capacitive reactance seen at the input of a SAW device. Second, equal power level input signals are applied to each input port of the unidirectional input transducer. Third, the tuning network creates an effective impedance at one input to the unidirectional transducer which exhibits a $+45°$ phase shift and a $-45°$ phase shift at the second input. Fourth, no additional resistance is added by the tuning network to increase the insertion loss of the SAW device.

Figure 1:
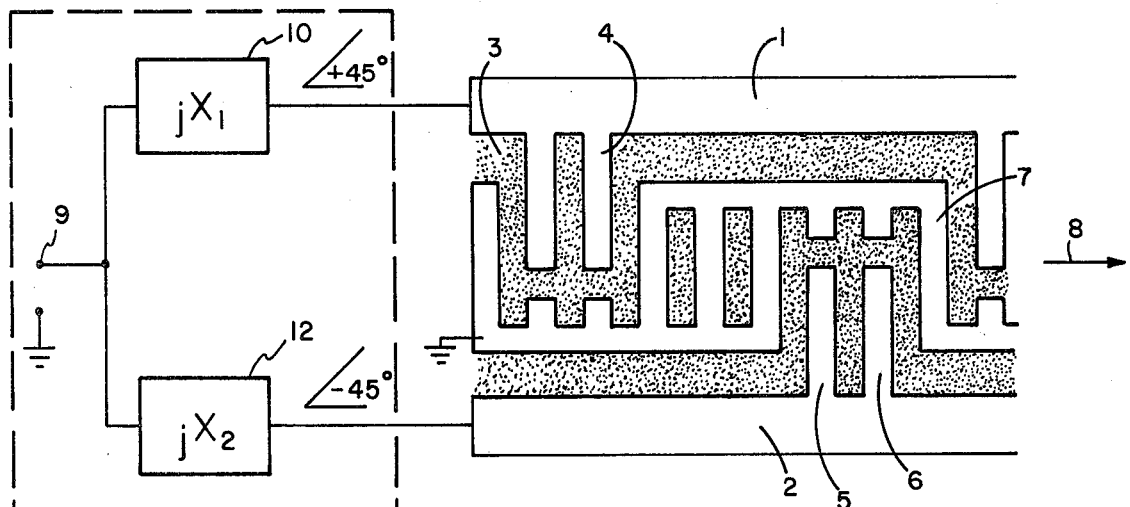
FIG. 1 is a representation of a portion of a unidirectional SAW transducer and a tuning network in accordance with one embodiment of the present invention.

Referring now to FIG. 1, unidirectional input transducer is shown (in part) having input ports 1 and 2. Input port 1 is provided with a number of fingers 3 and 4 and input port 2 is provided with similar fingers, 5 and 6. An interleaved and grounded network 7 is emplaced between fingers 3, 4 and 5, 6. All conductive lines and spaces are $\frac{1}{8}\lambda$ in width, where $\lambda$ is the wavelength of the center frequency which is to be applied as an input signal to the unidirectional transducer. It is well-known that the application of an external phase shift between input ports 1 and 2 of 90 degrees will cause the surface waves induced by fingers 3, 4 and 5, 6 to add constructively in the direction shown by arrow 8 and to combine destructively in the reverse direction. Signals to be filtered are applied via input terminal 9 to tuning reactances 10 and 12 and thence to input ports 1 and 2, respectively.

Prior to providing examples of the impedances which can be utilized as reactances 10 and 12, it is necessary to determine their characteristics in accordance with the above stated four requirements. The input impedances $Z_1$ and $Z_2$ of input ports 1 and 2 are identical and can be written as follows:

$$Z_1 = A\angle-\phi = A\cos\phi - jA\sin\phi \qquad (1)$$

$$Z_2 = A\angle-\phi = A\cos\phi - jA\sin\phi \qquad (2)$$

$A\cos\phi$ is the resistive component of the impedances seen at each of ports 1 and 2 whereas $-jA\sin\phi$ is the reactive (capacitive) portion of the impedance. The quantity A is dependent upon the percent band width, shape factor, beam width, particular SAW device structure and parasitic conductances and capacitances. It can be either measured empirically or derived theoretically. The equations for theoretical derivations are discussed below.

In order to eliminate the reactive capacitive component $-jA\sin\phi$, reactances 10 and 12 are added, leading to equations 3 and 4.

$$Z_1' = A'\angle-\phi = A\cos\phi - jA\sin\phi + jX_1 \qquad (3)$$

$$Z_2' = A'\angle-\phi = A\cos\phi - jA\sin\phi + jX_2 \qquad (4)$$

Since it is required that the input to ports 1 and 2 be related in a quadrature fashion and in specific, the input to port 1 be 45 degrees advanced from the origin and the input to input port 2 be retarded by an angle of 45 degrees from the origin, the following results:

$$A'\angle+45° = A\cos\phi - jA\sin\phi + jX_1 \qquad (5)$$

$$A'\angle-45° = A\cos\phi - jA\sin\phi + jX_2 \qquad (6)$$

In order to find the quantities $X_1$ and $X_2$ in equations 5 and 6, the polar terms $A'$ and $\angle 45°$ may be solved independently of each other. The j term in equation 5 can be eliminated and the equation solved in the following manner:

$$\text{Tan } 45° = 1 = \frac{\text{IMAGINARY}}{\text{REAL}} = \frac{-A\sin\phi + X_1}{A\cos\phi} \qquad (7)$$

$$A\cos\phi = -A\sin\phi + X_1 \qquad (8)$$

$$X_1 = A(\sin\phi + \cos\phi) \qquad (9)$$

Since the tangent of $-45$ degrees is minus 1, the solution to equation 6 results in the following:

$$X_2 = A(\sin\phi - \cos\phi) \qquad (10)$$

To solve for the value of $A'$, the following equation results:

$$A' = \sqrt{(A\cos\phi)^2 + (-A\sin\phi + X_1)^2} \qquad (11)$$

By substituting the value from equation 9 into equation 11, the solution is:

$$A' = \sqrt{2}A\cos\phi \qquad (12)$$

When reactances $X_1$ and $X_2$ are then placed between input terminal 9 and input ports 1 and 2, respectively, input terminal 9 sees impedances $Z_1'$ and $Z_2'$ in parallel yielding the following:

$$Z_T = \frac{Z_1' Z_2'}{Z_1' + Z_2'} = |A\cos\phi| \angle 0° \qquad (13)$$

Equation 13 shows that the total input impedance of the unidirectional input transducer is a purely real impedance and all of the capacitive reactances has been eliminated by the insertion of reactances 10 and 12.

Figure 2:
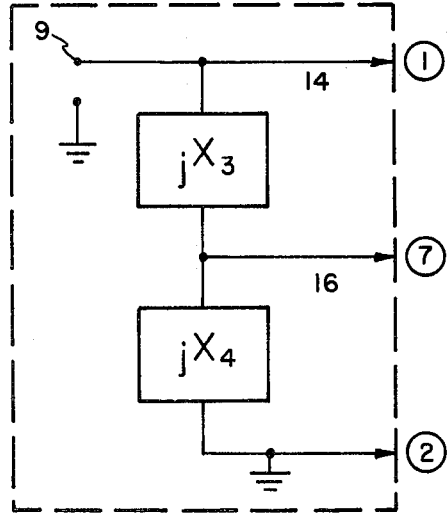
FIG. 2 is a block representation of an alternative tuning network.

Referring now to FIG. 2, a parallel tuning network is shown. In this instance, reactance 14 ($jX_3$) is connected between input port 1 and network 7. In this configuration network 7 is not grounded, but rather is used as an active input port. Reactance 16 ($jX_4$) is connected between network 7 and port 2 which is grounded.

A similar analysis as that described for the circuit of FIG. 1 will show that, to meet the four aforementioned requirements, the impedances are as follows:

$$X_3 = A/\sin\phi + \cos\phi \qquad (14)$$

$$X_4 = A/\sin\phi - \cos\phi \qquad (15)$$

The total impedance seen from input terminal 9 is $$Z_t = |A/\cos\phi| \angle 0° \qquad (16)$$

For the tuning configuration shown in either FIG. 1 or FIG. 2, the magnitude of the respective input impedances seen looking into the unidirectional input ports are identical. Therefore, the power delivered to each port is the same. The necessary quadrature relationship between the currents applied to the ports is provided by the reactive components thereby satisfying the requirements for unidirectional power flow when driving both ports of the transducer from a single source.

As above stated, the values of A and $\phi$ can be determined either empirically by taking the necessary measurements or can be derived mathematically. The mathematical derivation for a nonweighted unidirectional input transducer will not be derived here; however, it can be shown that the input conductance of such transducer is:

$$G_a = 8k^2 f_o C_s N^2 \qquad (17)$$

where $k^2$ is the piezoelectric coupling coefficient, $f_o$ is the center frequency, N is the number of finger pairs and $C_s$ the finger pair capacitance which is a function of the substrate material and transducer beam width. With both input ports 1 and 2 active, the impedance is $$A = 2\left[ Nf_o C_s \sqrt{(2\pi)^2 + (8k^2N)^2} \right]^{-1} \qquad (18)$$

$$\phi = \text{Tan}^{-1}\left[ \frac{2\pi f_o N C_s}{8k^2 f_o C_s N^2} \right] = \text{Tan}^{-1}\left[ \frac{\pi}{4k^2 N} \right] \qquad (19)$$

where the factor of 2 preceding the bracketed trem in the magnitude equation 16 arises from splitting the transducer into 1 and 2. Letting $x = 4k^2/\pi N$, equations 18 and 19 are rewritten as $$A = 2[N\omega_o C_s \sqrt{1+X^2}]^{-1} \qquad (20)$$

$$\phi = TAN^{-1}[X^{-1}] \qquad (21)$$

Turning now to some specific examples which will enable a fuller understanding of the invention, many broad bandwidth filters with few fingers exhibit an input impedance of $Z_1 = Z_2 = 300\angle-80°$. These fingers have been empirically determined. Therefore, $A = 300$ and $\phi = 80$ degrees. In order therefore to achieve the proper phase relationship (i.e., $\pm 45°$), $X_1$ must provide a +135° phase shift (+135°−80°=+45°) and $X_2$ must provide a +35° phase shift (+35°−80°=−45°).

The calculation of the reactance of the tuning elements is as follows:

$$X_1 = A(\cos \phi + \sin \phi) = 347.54 \Omega$$

$$X_2 = A(\sin \phi - \cos \phi) = 243.35 \Omega$$

Since the sign of both impedances is positive, an inductor is indicated as being the required tuning element. To determine the size of the inductor, the following equation is utilized:

$$X_1 = \omega_o L_1 = 347.54$$

and $$X_2 = \omega_o L_2 = 243.35$$

Figure 3:
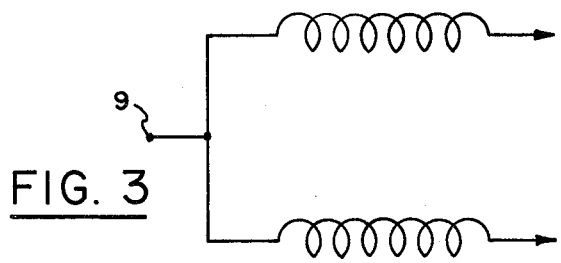
FIGS. 3, 4 and 5 are schematics of tuning networks in accordance with the invention.

For the specific example where $f_o = 43.5$ MHZ, $\omega_o = 2.73 \times 10^8$; $L_1 = 1.27$ μh and $L_2 = 0.89$ μh. (See FIG. 3) The magnitude of $Z_t$ (input impedance) using the aforementioned coils yields $|A \cos \phi| = 52.09\Omega$. If a tapped coil is employed to provide the 2 inductors, the ratio of the turns on either side of the tap is $L_1/L_2 = 0.70$.

For certain narrow band filters with many fingers, the input impedance is found to be the following:

$$Z_1 = Z_2 = 300 \angle -30°$$

Therefore, A−300 and $\phi = 30°$. The calculation of the tuning elements proceeds as follows:

$$X_1 = A(\cos \phi + \sin \phi) = 410 \Omega$$

$$X_2 = A(\sin \phi - \cos \phi) = -110 \Omega$$

Figure 4:
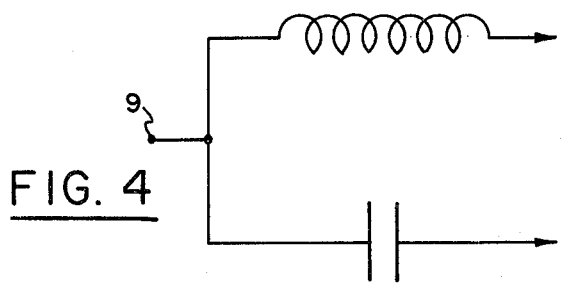

From an examination of the sign for $X_2$ it is seen that a capacitor is required whereas $X_1$ is an inductor (see FIG. 4). The calculation of the values of $X_1$ and $X_2$ is as follows:

$$W_0 L_1 = X_1 = 410 \qquad W_0 = 2.73 \times 10^8$$
$$W_0 L_2 = X_2 = -110$$
$$L_1 = 1.5 \mu h.$$
$$L_2 = 33.3 pf$$

There is one condition where only a single tuning element is required. That is when $Z_1 = Z_2 = 300 \angle -45°$. Thus, A=300 and $\phi = 45°$. The calculation of the tuning elements is as follows:

$$X_1 = A(\cos \phi + \sin \phi) = 424.26$$

$$X_2 = A(\sin \phi - \cos \phi) = 0$$

Figure 5:
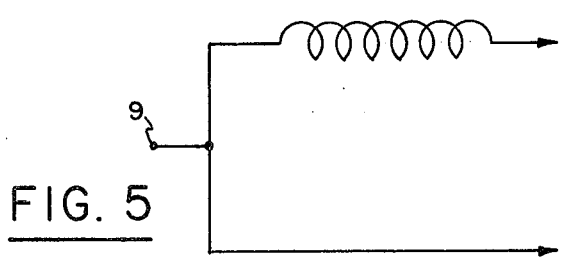

Therefore $X_1$ requires an inductor while no phasing element is required on the port 2 (FIG. 5). The calculation of the size of $X_1$ is:

$$W_0 L_1 = X_1 = 424.26 \qquad W_0 = 2.73 \times 10^8$$
$$L_1 = 1.55 \mu h$$

In all cases indicated above, the parallel tuning network can also be used, however, in the case where $Z_1 = 300 \angle -45°$, the equation for $X_4$ results in an open circuit being required between network 7 and port 2.

The present invention may be embodied in other specific forms without departing from spirit or essential characteristics thereof. For instance, while lumped elements have been shown, distributed reactances, may be employed (e.g. strip lines). Presently disclosed embodiments are therefore to be considered in all respects as illustrative and not restrictive, the scope of the invention being indicated by the appended claims.

What is claimed is:

1. A SAW device for filtering input signals received from a source including a unidirectional input transducer with first and second terminals, the application of quadrature related signals of equal power to said terminals resulting in the generation of a unidirectionally propagating wave form in said SAW device, the impedance looking into each terminal being A cos $\phi$ − jA sin $\phi$, the improvement comprising:

substantially nonresistive reactance means coupling said source of input signals to said terminals, said reactance means combined with said first terminal impedance providing a first terminal effective input impedance of A∠45°, and combined with said second terminal impedance providing a second terminal effective input impedance of A∠−45°.

2. A SAW device for filtering input signals received from a source including a unidirectional input transducer with first and second terminals, the application of quadrature related signals of equal power to said terminals resulting in the generation of a unidirectionally propagating waveform in said SAW device, the impedance looking into each terminal being A cos $\phi$ − jA sin $\phi$, the improvement comprising:

First and second substantially non-resistive reactive phase shift means coupled between said source and said terminals, said first phase shift means having a reactance equal to A(sin $\phi$ + cos $\phi$), said second phase shift means having a reactance equal to A(sin $\phi$ − cos $\phi$);

whereby the impedance looking from said source of input signal towards said first phase shift means is A∠45° and towards said second phase shift means is A∠−45°.

3. The invention as defined in claim 2 wherein said first reactive phase shift means is connected in series between said source of input signals and said first terminal and said second reactive phase shift means is connected in series between said source of input signals and said second reactive phase shift means.

4. The invention of claim 3 wherein said first and second reactive phase shift means are inductors.

5. The invention is defined in claim 3 wherein said first and second reactive phase shift means are an inductor and capacitor, respectively.

6. A SAW device for filtering input signals received from a source including a unidirectional input transducer with first and second terminals, the application of quadrature related signals of equal power to said terminals resulting in the generation of a unidirectionally propagating wave form in said SAW device, the impedance looking into each terminal being A cos $\phi$ − jA sin $\phi$, the combination comprising:

A source of input signals;

First and second substantially nonresistive reactive phase shift means coupled between said source and said terminals, said first phase shift means having a reactance equal to A/(sin $\phi$ + cos $\phi$), said second phase shift means having a reactance equal to A/(−sin $\phi$ − cos $\phi$);

whereby the impedance looking from said source of input signal towards said first phase shift means is A∠45° and into said second phase shift means is A∠−45°.

7. The invention as defined in claim 6 wherein said source is connected to said first terminal; said first reactive phase shift means is connected between said first and second terminals and said second reactive phase shift means is connected between said second terminal and a source of common potential.

* * * * *

UNITED STATES PATENT AND TRADEMARK OFFICE
CERTIFICATE OF CORRECTION

PATENT NO. : 4,200,849
DATED : April 29, 1980
INVENTOR(S) : Donald C. Malocha

It is certified that error appears in the above-identified patent and that said Letters Patent are hereby corrected as shown below:

Col. 5, line 41 "$W_o L_1$" should be --$\omega_o L_1$--

Col. 5, line 41 "$W_o$" should be --$\omega_o$--

Col. 5, line 42 "$W_o L_2$" should be --$\omega_o C_2$--

Col. 5, line 45 "$L_2$" should be --$C_2$--

Col. 5, line 59 "$W_o L_1$" should be --$\omega_o L_1$--

Col. 5, line 59 "$W_o$" should be --$\omega_o$--

Col. 6, line 19 "$A \angle 45°$" should be --$A' \angle 45°$--

UNITED STATES PATENT AND TRADEMARK OFFICE
CERTIFICATE OF CORRECTION

PATENT NO. : 4,200,849

DATED : April 29, 1980

INVENTOR(S) : Donald C. Malocha

It is certified that error appears in the above-identified patent and that said Letters Patent are hereby corrected as shown below:

(Cont'd.)

Col. 6, line 21 "A∠45°" should be --A'∠-45°--

Col. 6, line 38 "A∠45°" should be --A'∠45°--

Col. 6, line 39 "A∠-45°" should be --A'∠-45°--

Col. 7, line 1 "A∠45°" should be --A'∠45°--

Col. 7, line 2 "A∠-45°" should be --A'∠-45°--

Signed and Sealed this

Thirteenth Day of October 1981

[SEAL]

Attest:

GERALD J. MOSSINGHOFF

Attesting Officer     Commissioner of Patents and Trademarks